US008976125B2

(12) United States Patent
Wäller et al.

(10) Patent No.: US 8,976,125 B2
(45) Date of Patent: Mar. 10, 2015

(54) OPERATOR CONTROL APPARATUS AND METHOD FOR OPERATING AN OPERATOR CONTROL APPARATUS WITH IMPROVED APPROACH SENSING

(75) Inventors: Christoph Wäller, Braunschweig (DE); Katharina Bachfischer, Dusseldorf (DE); Lennart Bendewald, Wolfsburg (DE)

(73) Assignee: Volkswagen AG (DE)

( * ) Notice: Subject to any disclaimer, the term of this patent is extended or adjusted under 35 U.S.C. 154(b) by 851 days.

(21) Appl. No.: 13/120,088

(22) PCT Filed: Sep. 9, 2009

(86) PCT No.: PCT/EP2009/006740
§ 371 (c)(1),
(2), (4) Date: May 31, 2011

(87) PCT Pub. No.: WO2010/031565
PCT Pub. Date: Mar. 25, 2010

(65) Prior Publication Data
US 2011/0221696 A1    Sep. 15, 2011

(30) Foreign Application Priority Data

Sep. 22, 2008  (DE) .................. 10 2008 048 821

(51) Int. Cl.
G06F 3/041    (2006.01)
H03K 17/94    (2006.01)
(Continued)

(52) U.S. Cl.
CPC .............. *H03K 17/941* (2013.01); *B60K 35/00* (2013.01); *B60K 37/06* (2013.01); *G06F 3/0421* (2013.01);
(Continued)

(58) Field of Classification Search
None
See application file for complete search history.

(56) References Cited

U.S. PATENT DOCUMENTS 6,611,252 B1    8/2003  DuFaux
2004/0140959 A1*  7/2004  Matsumura et al. .......... 345/173
(Continued)

FOREIGN PATENT DOCUMENTS

DE            4336669 C1    12/1994
DE    10 2004 033275 A1    2/2006
(Continued)

OTHER PUBLICATIONS

PCT International Search Report for PCT/EP2009/006740 completed by the EP Searching Authority on Feb. 1, 2011.
(Continued)

*Primary Examiner* — Joseph Haley
*Assistant Examiner* — Emily Frank
(74) *Attorney, Agent, or Firm* — Barnes & Thornburg LLP

(57) ABSTRACT

The invention relates to an operator control apparatus and to a method for operating an operator control apparatus which comprises at least one operator control element for capturing user inputs and an approach recognition device which is designed to sense an approach by an actuating element, in particular a body part, of a user to the operator control element before the at least one operator control element is touched, wherein the approach recognition device comprises a reflection light barrier, which has at least one lamp (22a-22d) for emitting electromagnetic detection radiation (35) in front of the at least one operator control element into a physically limited detection area (4) which does not cover an entire volume in front of the at least one operator control element, and a reception element (28) for detecting a detection radiation (35) component which is scattered and/or reflected at the actuating element of the user during an approach to the at least one operator control element, wherein the approach recognition device is designed to recognize an approach from intensity of the received detection radiation.

22 Claims, 4 Drawing Sheets

(51) Int. Cl.
*B60K 35/00* (2006.01)
*B60K 37/06* (2006.01)
*G06F 3/042* (2006.01)

(52) U.S. Cl.
CPC . *B60K 2350/1012* (2013.01); *B60K 2350/1024* (2013.01); *B60K 2350/1028* (2013.01); *H03K 2217/94108* (2013.01)
USPC ........................................................ 345/173

(56) References Cited

U.S. PATENT DOCUMENTS

2008/0053233 A1  3/2008  Sugiura
2008/0211779 A1* 9/2008  Pryor ............................ 345/173

FOREIGN PATENT DOCUMENTS

| | | |
|---|---|---|
| DE | 102004044396 | 3/2006 |
| DE | 102004055376 A1 | 5/2006 |
| DE | 102005048021 | 4/2007 |
| DE | 102006037156 A1 | 9/2007 |
| EP | 0481138 B1 | 4/1992 |
| EP | 0891655 B1 | 7/2003 |
| EP | 1932725 A1 | 6/2008 |
| JP | 2000 329577 A | 11/2000 |
| WO | 98/39842 A1 | 9/1998 |
| WO | 2004/078536 A2 | 9/2004 |

OTHER PUBLICATIONS

English translation of ISR for PCT/EP2009/006740 completed by the EP Searching Authority on Feb. 1, 2011.
International Preliminary Report on Patentability for PCT/EP2009/006740 (German language).
International Preliminary Report on Patentability for PCT/EP2009/006740 (English language).

* cited by examiner

… … …

OPERATOR CONTROL APPARATUS AND METHOD FOR OPERATING AN OPERATOR CONTROL APPARATUS WITH IMPROVED APPROACH SENSING

CROSS-REFERENCE TO RELATED APPLICATIONS

This application is a U.S. national counterpart application of international application Serial No. PCT/EP2009/006740 filed Sep. 9, 2009. PCT/EP2009/006740 claims the benefit of German Patent Application No. 102008048821.6 filed Sep. 22, 2008.

The invention relates to an operator control apparatus according to the preamble of patent claim 1 and to an operator control method having the features of the preamble of patent claim 14.

In particular in modern motor vehicles, use is being increasingly made of operator control apparatuses which comprise at least one operator control element which are automatically changed as a function of an approach of an activation element, for example of a body part of a user, before the operator control element is actuated. Such a change can be, for example, adaptation of a backlight. Increasingly, display devices which are equipped with a position-determining measuring sensor which can determine a position of contact on a display surface by the activation element of the user are also being used. Such display devices are referred to as touchscreens. For example, operator control elements, which are also referred to as virtual operator control elements, are displayed on the display device, said operator control elements being assigned functions and/or actions which are carried out when such a display device which is embodied as a touchscreen is touched in the region where the corresponding virtual operator control element is represented. Since the display surface of the touchscreen is also used to output information, it is desirable to have available as much of the display surface as possible for a conveying of information when an activation action is not being performed on the part of the user. Displaying the virtual operator control elements or at least representing them with a size which permits largely fault-free contact in the representation region thereof even during travel on an uneven roadway covering therefore preferably takes place only when an activation intention on the part of the user is detected.

Operator control apparatuses in which an activation intention is detected by detecting an approach of the activation element of the user to the corresponding operator control element are known from the prior art. Such an interactive operator control apparatus and a method for operating such an interactive operator control apparatus are described, for example, in DE 10 2006 037 156. Said document describes that a position of the activation element relative to a display surface of a touchscreen is determined in three dimensions in space. For this purpose, a plurality of distance-measuring sensors which are arranged adjacent to the touchscreen are used and the position of the activation element is determined by means of triangulation. The distance-measuring sensors can be operated according to different principles.

In one described measuring principle, high frequency signals which are transmitted via the user's body are used. A high frequency transmitter is arranged near to the user's body. In a motor vehicle, such a high frequency transmitter is preferably located in an integrated fashion in a vehicle seat. The high frequency signals which are input into the user's body are received capacitively by the distance-measuring sensors. The distance of a body part from the distance-measuring sensor can be determined on the basis of a signal strength. The position of the body part in space can be determined by means of triangulation on the basis of a plurality of such distance-measuring sensors which are arranged in a sensor arrangement. The basic principle is described in more detail, for example, in document WO 2004/07 85 36.

DE 10 2006 037 156 alternatively describes a measuring principle which is configured with optical sensor units. An optical sensor unit for determining a distance can be configured, for example, according to the following principle. A transmitting LED irradiates a light signal which is amplitude-modulated in a squarewave form in the optical or infrared wavelength range. The light signal which is reflected at the object is captured by a photodiode. A reference light signal which has a phase offset of 180° and is also amplitude-modulated in a squarewave form is transmitted from a compensation LED to the photodiode over an invariable light path. The compensation LED is compensated by means of a control loop using a control signal in such a way that the received reflected light signal of the transmitter LED and the received reference light signal of the compensation LED cancel one another out at the photodiode and a common mode signal is detected. A change in the control signal is a measure of a distance from the activation element or object. A sensor unit which is configured according to this principle is largely independent of fluctuations in temperature and brightness.

The known apparatuses have in common the fact that they require a multiplicity of distance-measuring sensors in order to be able to reliably detect an approach to the touchscreen. This applies, in particular, if an approach to the touchscreen is intended to differ from an approach to operator control elements which are arranged adjacently. Furthermore, as a rule it is necessary to calibrate the distance-measuring sensors, since, for example, capacitive inputting is dependent on environmental influences, for example air humidity and/or individual conductivity of the user's skin, or on reflectivity of the activation element in the case of a measuring sensor which acts according to an optical principle.

The invention is therefore based on the technical problem of providing an operator control apparatus with an approach detection means which reliably and robustly detects an approach of an activation element to at least one operator control element, and which does not have the known disadvantages from the prior art.

The technical problem is solved according to the invention by means of an operator control apparatus having the features of patent claim 1, and by a method for operating such an operator control apparatus having the features of patent claim 14. Advantageous refinements of the invention can be found in the dependent claims.

In particular, an operator control apparatus is proposed which comprises at least one operator control element for capturing user inputs and an approach detection device which is designed to sense an approach by an activation element, in particular a body part, of a user to the at least one operator control element before the at least one operator control element is touched, wherein the approach detection device comprises a reflection light barrier which comprises at least one lighting means for emitting electromagnetic detection radiation in front of the operator control element into a spatially limited detection region which does not comprise the entire volume in front of the at least one operator control element, and a receiver element for detecting a portion of the detection radiation which is scattered or reflected at the activation element of the user when the at least one operator control element is approached, wherein the approach detection device is designed to detect an approach on the basis of an intensity of the received detection radiation. Whereas in the devices which are known from the prior art the electromagnetic radiation which is used by the at least one operator control element to convey information about the distance of the activation element from the at least one operator control element is irradiated into a large spatial angle range which comprises essentially the entire space in front of the at least one operator control element, in order to be able to reliably sense an approach, the invention provides that the detection radiation is emitted only into a locally limited detection region. The latter is arranged and configured in relation to the at least one operator control element in such a way that the activation element penetrates and/or passes through this detection region before and/or while the activation element makes activation-triggering contact with the at least one operator control element. In order to detect an approach, it is therefore sufficient to receive a portion of the reflected and/or scattered detection radiation which is above a threshold value. The threshold value is selected as a function of the spectral range of the detection radiation. The threshold value should be defined on the basis of whether or not background radiation is present at the place of use, for example in the motor vehicle, in this spectral range. If, for example, detection radiation in the optical or infrared wavelength range is used, it is necessary, for example in the case of use in a vehicle, to correspondingly take into account visible and/or infrared light entering through the vehicle windows. A method according to the invention for operating an operator control apparatus, in which the operator control apparatus comprises at least one operator control element for capturing user inputs and an approach detection device which senses an approach of an activation element, in particular of a body part of a user, to the at least one operator control element before the at least one operator control element is touched, is configured in such a way that, by means of at least one lighting means, electromagnetic detection radiation is emitted into a spatially limited detection region in front of the at least one operator control element, wherein the detection region does not comprise an entire volume in front of the at least one operator control element, and a portion of the detection radiation scattered at the activation element and/or reflected by this activation element is received by means of a receiver element when the activation element of the user approaches the at least one operator control element, and the approach is detected on the basis of an intensity of the received portion of the detection radiation.

The operator control apparatus is particularly advantageously embodied as a operator control apparatus in a vehicle, particularly preferably in a motor vehicle. The method is correspondingly configured as a method for operating an operator control apparatus in a vehicle, particularly preferably in a motor vehicle.

There is particularly preferably provision that the at least one operator control element is a touchscreen, and when an approach is detected the representation on the touchscreen is adapted. For this purpose, the touchscreen is preferably linked to a control device or comprises such a control device which controls the graphic representation on the display surface of the touchscreen.

In addition to a touchscreen, an operator control apparatus frequently comprises additional operator control elements which can be embodied, for example, as a pushbutton switch, twist and push switch, sliding controller, etc. In order to be able to differentiate an approach by the activation element to such an additional operator control element from an approach to the at least one operator control element, which is preferably embodied as a touchscreen, there is provision in one preferred embodiment of the invention that, in order to capture the user inputs, at least one additional operator control element is provided which is arranged adjacent to an edge of the display surface of the touchscreen, wherein the detection radiation of the at least one lighting means is emitted into the detection region which is in a detection plane, between the edge of the touchscreen and the at least one additional operator control element, wherein the detection plane and a plane of the display surface of the touchscreen enclose an angle of less than 90°, with the result that activation of the at least one additional operator control element is possible without the activation element penetrating the detection region. Depending on the installation position of the at least one operator control element and of the at least one additional operator control element, for example in the region of a motor vehicle cockpit, it is therefore possible that the user can activate in a contact-forming fashion an additional operator control element which is arranged along at least one edge of the at least one operator control element which is embodied as a touchscreen, without penetrating the detection region into which the detection radiation is emitted in front of the at least one operator control element. As a rule, the at least one operator control element which is embodied as a touchscreen is arranged in a center console in such a way that in the event of contact-forming activation of the at least one operator control element, i.e. of the touchscreen, the activation element is superimposed on or covers in each case a lower edge of the display surface of the touchscreen. If the reflection light barrier is consequently embodied in such a way that the detection radiation is emitted from underneath the touchscreen obliquely with respect to a surface normal of the display surface of the touchscreen into a spatially limited detection region which is of planar design, the activation element penetrates this detection region in the event of contact-forming activation. If, on the other hand, an additional operator control element which is arranged adjacent to the lower edge of the touchscreen is activated, contact-forming activation is possible without, for example, the knuckles penetrating the detection region, while the additional operator control element is activated in a contact-forming fashion.

Since it is frequently difficult to fill the detection region in front of the at least one operator control element completely and uniformly with the detection radiation which is emitted by an individual lighting means, in one development of the invention there is provision that the approach detection device comprises one or more additional lighting means which are designed to emit detection radiation into the detection region, wherein the at least one lighting means and the additional lighting means respectively emits their detection radiation into different spatial regions of the detection region. In some embodiments, these different spatial regions can at least partially overlap. In other embodiments, the different spatial regions are configured in such a way that they are very largely or completely disjunctive.

Whereas, given suitable emission of the detection radiation, operator control elements which are adjacent to the one edge of the touchscreen is possible between the one edge and the one further operator control element, contact-forming activation of further operator control elements which are embodied or arranged adjacent to other edges of the as a touchscreen is frequently not possible without the activation element penetrating the detection region in front of the at least one operator control element. However, in order to prevent the representation being adapted graphically in such situations in which only one further operator control element which is arranged adjacent to the at least one operator control element is to be activated, it is advantageous to be able to differentiate an approach to this at least one further operator control element separately from an approach to the at least one operator control element.

One preferred embodiment of the invention provides for this purpose that the approach detection device comprises at least one further lighting means for emitting electromagnetic detection radiation into a further detection region which is different from the detection region, at least one modulation device for modulating the emitted detection radiation of at least one of the lighting means, with the result that at least the further detection radiation which is emitted into the at least one further detection region differs from the detection radiation emitted into the detection region in terms of its modulation, and an analysis unit which is designed to analyze the received reflected and/or scattered detection radiation in terms of its modulation, in order to determine at least one scattered/reflected portion of the detection radiation emitted into the further detection region, separately from the scattered/reflected portion of the detection radiation emitted into the detection region, and to detect penetration of the activation element into the at least one further detection region on the basis of the intensity of the proportion of received reflected/scattered detection radiation emitted into this at least one further detection region.

The control device is then advantageously designed not to change the representation if, in addition to the approach to the at least one operator control element, penetration of the activation element into the at least one further detection region is detected. Therefore, by means of at least one further lighting means, detection radiation is emitted into a further detection region which is not located in front of the at least one operator control element, wherein the detection radiation emitted into the further detection region is modulated differently from the detection radiation emitted into the detection region, the received scattered/reflected detection radiation is analyzed in terms of the modulation in order to determine separately the portion of detection radiation which is emitted and reflected/scattered into the detection region and the portion of the detection radiation which is emitted and reflected/scattered into the further detection region, and to detect penetration of the activation element into the at least one further detection region on the basis of the intensity of the portion of received/reflected detection radiation.

In a further embodiment, the modulation apparatus is designed to modulate on a lighting-means-specific basis the detection radiation emitted into the detection region by the at least one lighting means and the additional lighting means, and the analysis unit is designed to analyze the received scattered/reflected detection radiation in terms of the modulation on a lighting-means-specific basis, in order to determine separately the portions reflected/scattered in the different spatial regions of the detection region, and to derive therefrom a position of the activation element in front of the at least one operator control element. This information can be used to adapt an adaptation of the representation to an operator control intention of the user in an improved way.

In one embodiment of the invention there is provision that the approach detection unit is designed to derive a movement of the activation element on the basis of the positions of the activation element which are sensed in chronological succession. This information can also be used to improve an adaptation of the graphic display on the at least one operator control element which is embodied as a touchscreen. It is also possible to use such movement information in order to carry out and/or assist a driver/front seat passenger detection on the basis of a movement direction, for example in a vehicle, in particular a motor vehicle. If it is assumed that an activation element respectively first penetrates that spatial region of the detection region which is most closely adjacent to the respective user, a user detection can be carried out and/or assisted on the basis of this position information and/or movement information.

Light emitting diodes are particularly suitable as lighting means. Light emitting diodes which emit detection radiation in the infrared wavelength range are particularly preferred since the latter is invisible to a user. In order to ensure that the light emitted by the lighting means, i.e. the electromagnetic detection radiation, is emitted only in a spatially limited detection region which is preferably embodied in the form of a fan, an optical device is preferably coupled to each lighting means. Such an optical device preferably comprises a cylinder lens which focuses the emitted light into a plane. In order to selectively bring about fanning out in the plane, in one preferred embodiment the optical device additionally comprises a deflection prism.

In order to direct the scattered reflected radiation as efficiently as possible onto the receiver element, which is preferably embodied as a photo-sensitive semiconductor element, particularly preferably as a photo-sensitive diode or photo-sensitive transistor, an optical device which is referred to as a reception optical device, is also arranged in front of the receiver element. Said reception optical device preferably comprises a cylinder lens. The reception optical device can in this way be configured such that it can jointly receive and detect scattered/reflected detection radiation both from the detection region in front of the at least one operator control element and from the at least one further detection region which is arranged in front of the at least one further operator control element.

The different lighting means are particularly preferably arranged on a common carrier circuit board. In addition, the various lighting means can be actuated by means of common actuation electronics, which are preferably embodied in an integrated circuit or a chip. These actuation electronics can be configured in such a way that the modulation of the detection radiation is carried out on a lighting-means-specific basis.

While it has proven advantageous to use, in front of the at least one operator control element which is embodied as a touchscreen, a detection region which is embodied in the form of a plane and which encloses an angle of approximately 70° with a plane of the display surface, a further detection region which extends along a lateral edge in front of operator control elements arranged there is also embodied in the form of a plane, but encloses a significantly smaller angle range in relation to the plane of the display surface.

In order to suppress adaptation of the graphic representation on the display surface of the at least one operator control element which is embodied as a touchscreen, in situations in which the user "reaches past" the at least one operator control element in the course of an activation action of another operator control element or in the course of some other action, there is provision in one embodiment of the invention that the control unit is designed not to change the representation after the approach of the activation element to the at least one operator control element has been detected until a predefined time period has passed, wherein the predefined time period corresponds to a time which, in the case of an average movement of the activation element to the at least one further operator control element, is detected between the detection of the approach of the activation element to the at least one activation element on the basis of the received reflected and/or scattered detection radiation detected into the detection region and the detection of the approach to the at least one further operator control element on the basis of the scattered and/or reflected detection radiation emitted into the at least one further detection region.

In other embodiments there can be provision that further detection regions are provided adjacent to the edges or along the edges arranged operator control elements, into which detection regions detection radiation is emitted using lighting means, with the result that reaching over these edges can also be detected. By means of suitable modulation of the detection radiation it is respectively possible to detect all the scattered and/or reflected detection radiation by means of the one receiver element.

In order to achieve a high level of sensitivity of the receiver element, a screen is provided in front of or around the receiver element, which screen hinders or prevents direct incidence of light from the lighting means.

In one advantageous embodiment of the invention, compensation of background radiation existing at a place of use, for example in a motor vehicle, is carried out in the frequency range of the detection radiation by reference radiation from a reference lighting means which is preferably embodied in a way identical to the other lighting means being directed in a chronologically alternating fashion with respect to the emission of the detection radiation, onto the detection element over a fixed, invariable lighting path. On the basis of a comparison of the intensity which is measured for the reference radiation at different detection times, it is possible to infer a change in the background radiation.

In order to additionally take into account a change in the irradiation characteristic of the lighting means, for example on the basis of temperature fluctuations, during continuous operation, reference measurements are preferably additionally carried out if no approach by the activation element is detected.

The features of the method according to the invention have the same advantages as the corresponding features of the apparatus according to the invention.

The invention will be explained in more detail below on the basis of preferred exemplary embodiments.

Figure 1:
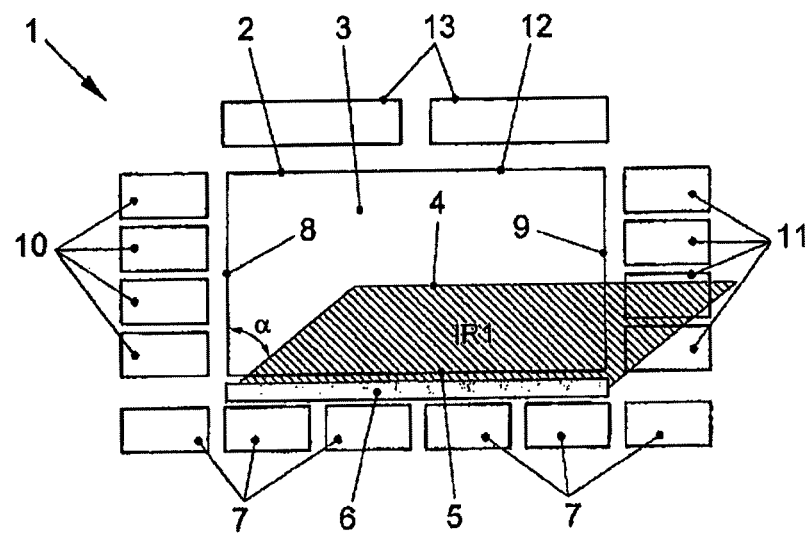
FIG. 1 shows a schematic illustration of an operator control apparatus with a reflection light barrier.

FIG. 1 is a schematic illustration of an operator control apparatus 1 with a reflection light barrier. The operator control apparatus comprises an operator control element which is embodied as a touchscreen 2. Graphic information can be displayed on a display surface 3 of the touchscreen 2 by means of a control device. In order to be able to implement a graphic representation on the display surface 3 when an activation element (not illustrated) approaches the touchscreen 2, the control device is coupled to an approach detection device. The approach detection device can be at least partly integrated into the control device. The approach detection device emits electromagnetic detection radiation, preferably in the infrared wavelength range, into a detection region 4 which is arranged in a spatially limited fashion in a spatial plane. The emission of the detection radiation for the generation of the detection region 4 is selected in such a way that an activation element, for example a hand, of the user penetrates the detection region 4 as a function of an arrangement of the touchscreen 2 in relation to a user, or penetrates said detection region 4 before contact-forming activation.

In the illustrated embodiment of the operator control apparatus 1, a plane in which the detection region 4 is arranged encloses, with a plane of the display surface 3, an angle α which is less than 90°. The angle α is preferably approximately 75°. The detection radiation is emitted into the space in front of the touchscreen adjacent to a lower edge 5 of the display surface 3 of the touchscreen 2. Additional operator control elements 7 which are embodied as pushbutton switches are provided underneath the lower edge 5 and underneath an emission window 6 which is transparent to the detection radiation. As a result of the fact that the detection region 4 of the reflection light barrier is not emitted along a surface normal of each plane in which the additional operator control elements 7 are also arranged, said additional operator control elements 7 can be operated in a contact-forming fashion by an activation element without this activation element entering the detection region 4 of the reflection light barrier and triggering the latter. This is advantageous, for example, when the operator control apparatus 1 is arranged in a center console of a motor vehicle. The additional operator control elements 7 can be operated by the activation element of the user without the latter penetrating the detection region 4 of the reflection light barrier. By suitably selecting the angle α, this can be implemented for different installation heights relative to a seat surface height of the seat on which the user or users is/are seated. Further operator control elements 10, 11 are arranged adjacent to lateral edges 8, 9. In addition, further operator control elements 13 are again arranged above an upper edge 12 of the display surface 3 of the touchscreen 2.

Figure 2:
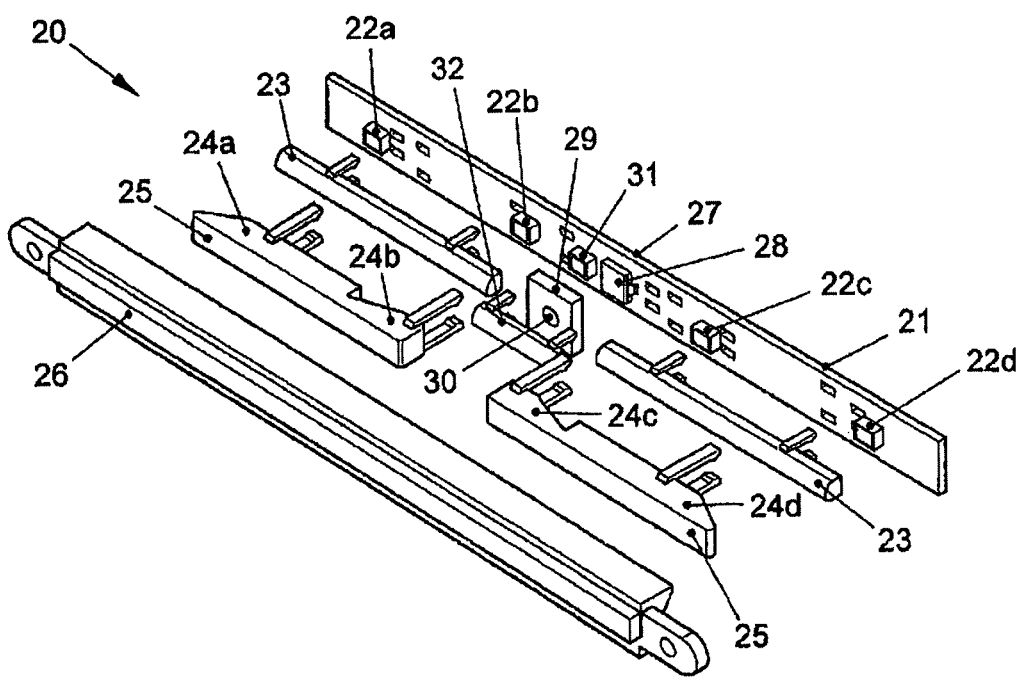
FIG. 2 shows a schematic exploded drawing of an optical unit for implementing a reflection light barrier.

FIG. 2 is a schematic exploded drawing of an optical unit 20 of a reflection light barrier. Lighting means 22a-22d for emitting detection radiation are arranged essentially spaced equally apart from one another on a carrier circuit board 21. The lighting means 22a-22d are preferably embodied as light emitting diodes which irradiate in the infrared wavelength range. Cylinder lenses 23 are arranged in front of the lighting means 22a-22d. Said cylinder lenses 23 cause the detection radiation to be focused into a plane. In order to cause the detection radiation to be widened over an angle range within the detection plane, deflection prisms 24a-24d are provided, two of which are respectively combined in optical elements 25. The optical unit 20 is closed off by a closure diaphragm or an emission window 26. The latter is transparent in the wavelength range or frequency range of the detection radiation. A receiver element 28 which is preferably embodied as a photodiode is arranged in a center 27 of the carrier circuit board 21. In order to prevent direct radiation or collection of scattered radiation from the lighting means 22a-22d, a screen 29, which comprises an inlet opening 30, is arranged over the receiver element 28. A reference lighting means 31, which is preferably of identical design to the lighting means 22a-22d, is located underneath the screen 29, together with the receiver element 28. Said reference lighting means 31 is provided in order to emit, in a chronologically alternating fashion with respect to the lighting means 22a-22d, reference radiation in the same wavelength range or frequency range as the lighting means 22a-22d, and in this way to permit compensation in terms of background radiation at the place of use, for example in a vehicle.

Provided in front of the inlet opening 30 of the screen 29 is a further cylinder lens 32 in order to focus onto the receiver element 28 the detection radiation, scattered and/or reflected at an activation element, of the lighting means 22a-22d, which detection radiation has passed through the emission window 26.

The optical unit 20 illustrated in FIG. 2 is supplemented by the actuation electronics which can be embodied on the carrier circuit board 21 or separately. Said actuation electronics are preferably embodied in an integrated circuit and are capable of actuating the lighting means 22a-22d as well as the reference lighting means 31. In this context it is preferably possible to generate the detection radiation or reference radiation determined by the individual lighting means 22a-22d and the reference lighting means 31 in a lighting-means-specific, preferably frequency-modulated, fashion. The approach detection unit also comprises evaluation electronics which evaluate the received scattered/reflected detection radiation and/or reference radiation in terms of the intensity. In some embodiments, the evaluation electronics and actuation electronics of the approach detection unit can be integrated into a control device which controls a graphic representation on the display surface 3 of an operator control element which is embodied as a touchscreen.

Figure 3:
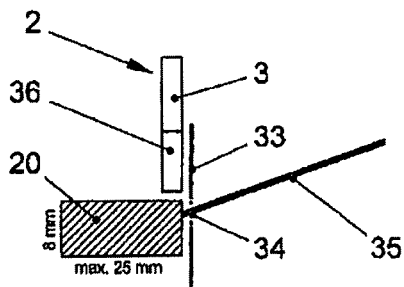
FIG. 3 shows a schematic illustration explaining installation of a reflection light barrier adjacent to an operator control element which is embodied as a touchscreen.

FIG. 3 is schematic a schematic illustration of the installation of an optical unit 20, adjacent to a touchscreen 2 in a way which is similar to FIG. 2. The optical unit 20 is arranged underneath a display frame 36 which surrounds an active display surface 3 of the touchscreen 2. Both the display frame 36 and the optical unit 20 are covered by a cover diaphragm 33 which comprises at least one exit region or window region 34 for the detection radiation 35. The cover 33 with the window region 34 can replace the emission window 26 of the optical unit 20 according to FIG. 2. The optical unit 20 is preferably embodied in such a way that it comprises adjustment elements (not illustrated) which permit the optical unit to be oriented relative to a plane of the display surface 3 of the touchscreen 2. In addition, the optics of the optical unit 20 is preferably embodied in such a way that the detection radiation is not emitted perpendicularly with respect to a plane of the carrier circuit board but rather at an angle thereto in a plane which encloses an angle α of less than 90° with the display surface 3.

Figure 4:
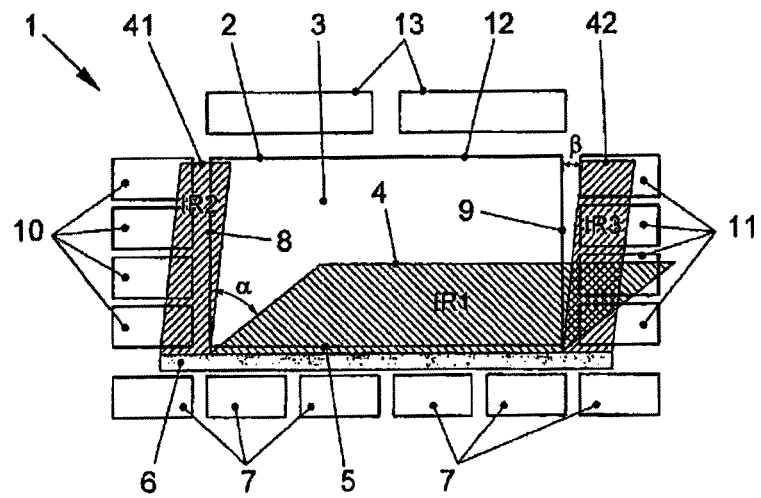
FIG. 4 shows a schematic illustration of an operator control apparatus having a plurality of detection regions.

FIG. 4 illustrates a further embodiment of an operator control apparatus 1 in a way which is similar to that according to FIG. 1, in which, however, in addition to the detection region 4, further detection regions 41 and 42 which are embodied in a corresponding way in front of the further operator control elements 10 and 11 are embodied in front of the display surface 3 of the touchscreen 2. The further detection regions 41, 42 are embodied in a spatial plane which encloses, relative to the plane of the display surface 3 of the touchscreen 2, an angle β which is smaller than the angle α which is enclosed by the plane in which the detection region 4 is located and by the plane of the display surface 3. The further lighting means which emit detection radiation into the further detection regions 41, 42 are advantageously arranged on the same carrier circuit board as those lighting means which emit detection radiation into the detection region 4.

In order to be able to assign to the individual detection regions 4, 41, 42 the detection radiation which is reflected at an activation element and is captured by the receiver element of the approach detection device, the detection radiation which is emitted into the different detection regions 4, 41, 42 is modulated at least on a detection-region-specific basis. An assignment to the individual detection regions 4, 41, 42 can therefore be made by analyzing the modulation of the received detection radiation. In this way it is possible to differentiate activation situations in which an activation element of the user approaches the touchscreen 2 but an activation action which can be sensed by the touchscreen 2 is not to be performed but instead one of the further operator control elements 10, 11 is to be activated. In such a case it is desirable for the representation on the display surface 3 of the touchscreen 2 not to be adapted. If, for example, a user seated to the left of the display surface 3 of the touchscreen 2 activates one of the operator control elements 11 arranged to the right of the lateral edge 9 of the display surface 3, the activation element penetrates both the detection region 4 and the further detection region 42. By applying a suitable logic operation it is possible for the approach detection unit and/or the control unit to detect such a situation and to suppress or fail to perform adaptation of the representation. Suppression is to take place, for example, in a situation in which both an approach to the touchscreen 2 and an approach to one of the further operator control elements 11 have been detected, and in addition the approach to the touchscreen has been detected before an approach to the further operator control elements 11. If the logic variables IR1, IR2, IR3 are assigned to the individual detection regions 4, 41, 42 in this order, and if the time at which an approach into the detection region IRX is detected is denoted by T(IRX), the logic condition can be formulated as:

$$(IR1 \ \& \ IR3\text{=true}) \ \& \ (T(IR1) < T(IR3)).$$

Correspondingly, suppression in the event of activation by a front seat passenger arranged on the right-hand side of the touchscreen 2 would fail to occur if the following logic condition were met:

$$(IR1 \ \& \ IR2\text{=true}) \ \& \ (T(IR1) < T(IR2)).$$

Figure 5:
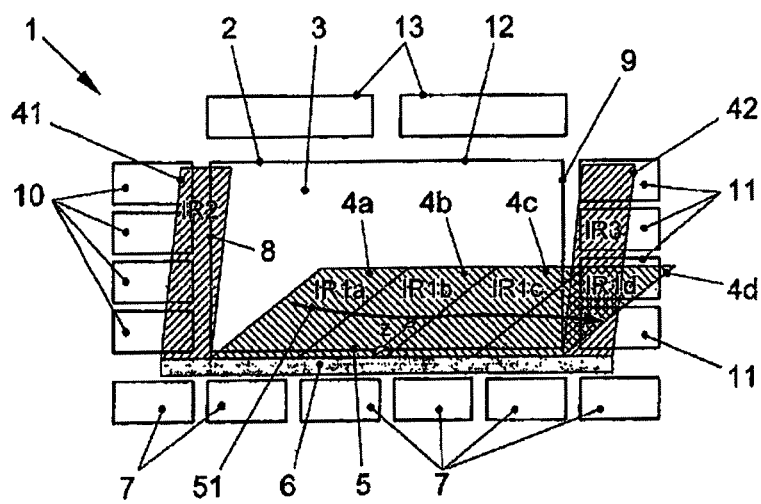
FIG. 5 shows a schematic illustration of an operator control apparatus in which the detection region in front of the operator control element which is embodied as a touchscreen is divided into different subregions.

FIG. 5 illustrates a further embodiment in which the detection region 4 is divided into subregions 4a-4d to which the logic variables IR1a-IR1d are assigned. Detection radiation is emitted into each of the subregions 4a-4d, respectively from one of the lighting means, wherein the detection radiation is respectively modulated differently in the different subregions 4a-4d. This makes it possible to determine a position of the activation element within the detection region 4 on the basis of the received portions which can be assigned to the individual subregions 4a-4d. A movement of an activation element can be additionally determined on the basis of an evaluation with time resolution. In each case, the distance or a portion of the reflection surface of the activation element in the corresponding subregion 4a-4d can be inferred on the basis of the intensity portion of the detection radiation which is assigned to the individual subrange 4a-4d. The movement direction can then also be determined on the basis of analysis with time resolution, as is indicated by an arrow 51 in FIG. 5.

Figure 6:
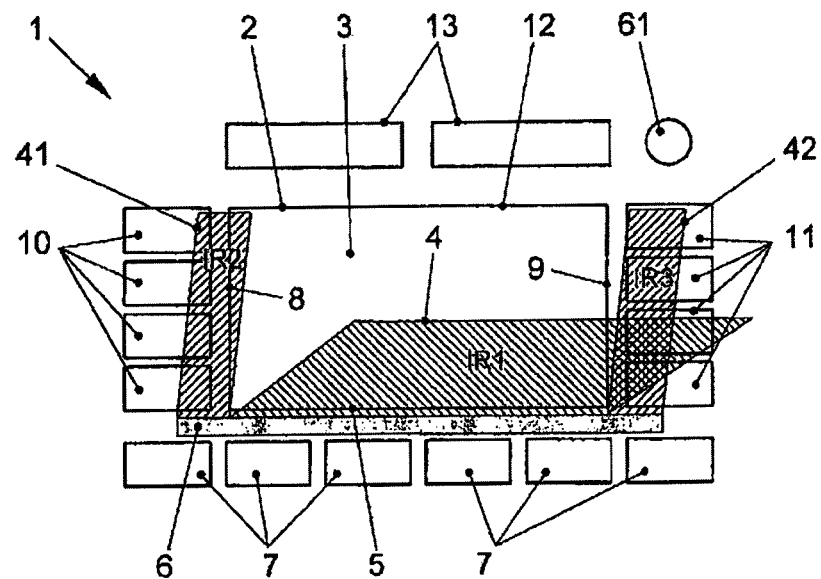
FIG. 6 shows a schematic illustration similar to that according to FIG. 4, in which the operator control apparatus is additionally coupled to a user detection device.

FIG. 6 is a schematic illustration of an embodiment which is similar to that according to FIG. 4. In addition, there is a schematic illustration of a further receiver unit which is designed to capacitively sense high frequency signals which are input into the user. This makes it unambiguously possible to carry out, for example, driver/front seat passenger detection in a vehicle, in particular a motor vehicle. In such an embodiment, adaptation of the representation on the display surface 3 of the touchscreen 2 is suppressed if the following applies:

(IR1 & IR3=true) & (F=true) or (IR1 & IR2=true) & (B=true), where F and B represent the driver or front seat passenger. Of course, any other systems can also be used for the detection of the driver/front seat passenger.

Figure 7:
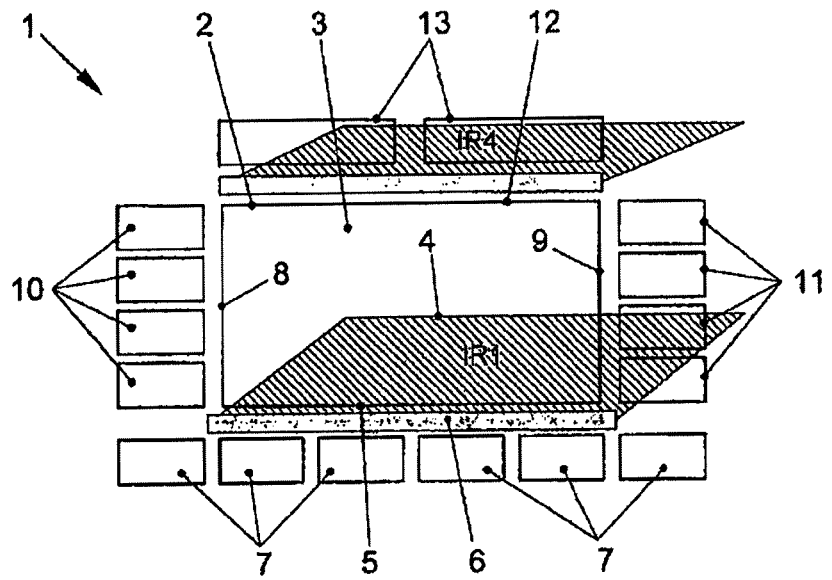
FIG. 7 shows a schematic illustration of an operator control apparatus in which vertical reaching over can be detected.

FIG. 7 illustrates an embodiment of an operator control apparatus in which suppression of an adaptation of the representation on the display surface 3 of the touchscreen 2 can be suppressed in the event of vertical reaching over, for example if the operator control elements 13 are activated. For this purpose there is provision that detection radiation is emitted between the upper edge 12 and the operator control elements 13, into a detection region 71 which is preferably located in a plane which is embodied perpendicularly with respect to the display surface 3 of the touchscreen 2. If a presence is sensed in the detection region 4 and the additional detection region 71, wherein penetration into the detection region 4 occurs before penetration into the additional detection region 71, a change in the representation is suppressed. In abbreviated annotation, the logic condition reads:

(IR1 & IR4=true) & (T(IR1)<T(IR4)), where the logic variable IR4 is assigned to the additional detection region 71.

Figure 8:
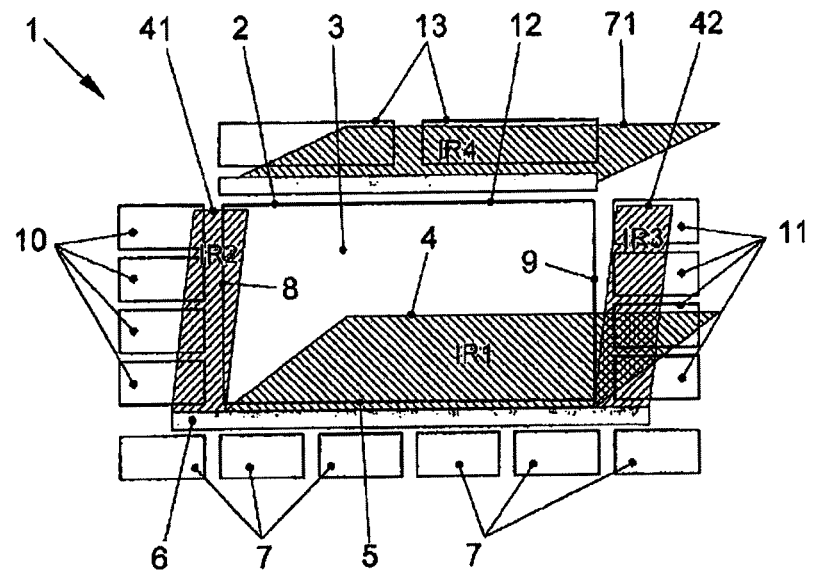
FIGS. 8 and 9 show different schematic illustrations of optical control devices in which both horizontal and vertical reaching over can be detected.
Figure 9:
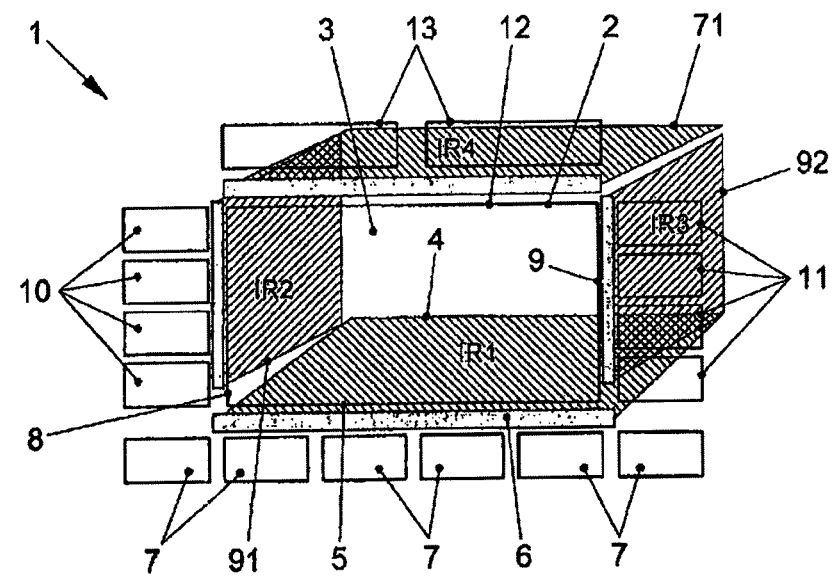

FIG. 8 illustrates an operator control apparatus 1 which corresponds to a combination of the embodiments according to FIGS. 4 and 7. In FIG. 9, an embodiment is additionally illustrated in which the detection regions 91, corresponding to further detection regions 41, 42 according to FIG. 3 are not formed by detection radiation which is emitted laterally from the display surface 3 adjacent to the lower edge 5 of the display surface. Instead, detection radiation is respectively emitted perpendicularly with respect to the display surface 3, adjacent to the lateral edges 8, 9. As a result, the detection regions 91, 92 are formed, to which detection regions 91, 92 the logic designations IR2 and IR3 are correspondingly assigned. In the embodiments according to FIGS. 8 and 9, suppression takes place if one of the following logic conditions is met:

(IR1 & IR4=true) & (T(IR1)<T(IR4)), this corresponds to an operator control operation of one of the operator control elements 13 above the upper edge 12 of the display surface 3, or (IR1 & IR3=true) & (T(IR1)<T(IR3)), this corresponds to an operator control operation of the further operator control elements 11, for example by a driver who is positioned to the left of the display surface 3, or (IR1 & IR2=true) & (T(IR1)<T(IR2)), this corresponds to an operator control operation of the further operator control elements 8 arranged to the left of the display surface 3, for example by a front seat passenger who is arranged to the right of the display surface 3.

It is apparent to a person skilled in the art that only exemplary embodiments have been described here. The individual features of the embodiments described can be used in any desired combination in order to implement the invention.

LIST OF REFERENCE SYMBOLS

1 Operator control apparatus
2 Touchscreen
3 Display surface
4 Detection region
α Angle between the plane in which the detection region 4 is located and a plane of the display surface 3
5 Lower edge
6 Emission window
7 Additional operator control elements
8, 9 Lateral edges
10, 11 Further operator control elements
12 Upper edge
13 Again further operator control elements
20 Optical unit
21 Carrier circuit board
22a-22d Lighting elements
23 Cylinder lens
24a-24d Deflecting prism
25 Optical elements
26 Emission window
27 Center
28 Receiver element
29 Screen
30 Entry opening
31 Reference lighting means
32 Further cylinder lens
33 Cover plate
34 Exit region or window region
35 Detection radiation
36 Display frame
41, 42 Further detection regions
51 Arrow
61 Further receiver unit
71 Detection region
91, 92 Further detection regions
β Enclosed angle between a plane of the further detection regions 41, 42 and a plane of the display surface 3

The invention claimed is:

1. An operator control apparatus comprising
at least one operator control element for capturing user inputs;
an approach detection device configured to sense an approach by an activation element, comprising a body part of a user, to the operator control element before the at least one operator control element is touched, wherein the approach detection device comprises a reflection light barrier comprising at least one lighting means for emitting electromagnetic detection radiation in front of the at least one operator control element into a spatially limited detection region which does not comprise an entire volume in front of the at least one operator control element; and
a receiver element for detecting a portion of the detection radiation which is scattered and/or reflected at the activation element of the user when the at least one operator control element is approached, wherein the approach detection device is configured to detect an approach on the basis of the intensity of the received detection radiation,
wherein the at least one lighting means is coupled to an optical device which deflects the emission of the detection radiation into a fan-shaped spatial region.

2. The operator control apparatus as claimed in claim 1, wherein the at least one operator control element is a touchscreen which is linked to a control apparatus which changes a graphic representation on a display surface of the touchscreen when an approach by the activation element is detected.

3. The operator control apparatus as claimed in claim 2, wherein in order to capture the user inputs at least one additional operator control element is provided which is arranged adjacent to an edge of the display surface of the touchscreen, wherein the detection radiation of the at least one lighting means is emitted between the edge of the touchscreen and the at least one additional operator control element, into the detection region which is in a detection plane, wherein the detection plane and a plane of the display surface enclose an angle (α) of less than 90°, with the result that activation of the at least one additional operator control element is possible without the activation element penetrating the detection region.

4. The operator control apparatus as claimed in claim 1, wherein the approach detection device comprises one or more additional lighting means which are designed to emit detection radiation into the detection region, wherein the at least one lighting means and the additional lighting means respectively emit their detection radiation into different spatial regions of the detection region.

5. The operator control apparatus as claimed in claim 4, wherein the approach detection device comprises
at least one further lighting means for emitting electromagnetic detection radiation into a further detection region which is different from the detection region,
at least one modulation device for modulating the emitted detection radiation of at least one of the lighting means, with the result that at least the further detection radiation which is emitted into the at least one further detection region differs from the detection radiation emitted into the detection region in terms of its modulation, and
an analysis unit which is designed to analyze the received reflected and/or scattered detection radiation in terms of its modulation, in order to determine at least one scattered/reflected portion of the detection radiation emitted into the further detection region, separately from the scattered and/or reflected portion of the detection radiation emitted into the detection region, and to detect penetration of the activation element into the at least one further detection region on the basis of the intensity of the proportion of received reflected and/or scattered detection radiation emitted into this at least one further detection region.

6. The operator control apparatus as claimed in claim 5, wherein the control unit is designed to fail to change the representation if, in addition to the approach to the at least one operator control element, penetration of the actuation element into the at least one further detection region is detected.

7. The operator control apparatus as claimed in claim 6, wherein the control unit is designed not to change the representation after the approach of the activation element to the at least one operator control element has been detected until a predefined time period has passed, wherein the predefined time period corresponds to a time which, in the case of an average movement of the activation element to the at least one further operator control element, is detected between the detection of the approach of the activation element to the at least one activation element on the basis of the received reflected and/or scattered detection radiation emitted into the detection region and the detection of the approach to the at least one further operator control element on the basis of the scattered and/or reflected detection radiation emitted into the at least one further detection region.

8. The operator control apparatus as claimed in claim 5, wherein the one additional lighting means or the additional lighting means and/or the at least one further lighting means are each coupled to an optical device which deflects the emission of the detection radiation into a fan-shaped spatial region.

9. The operator control apparatus as claimed in claim 4, wherein at least one modulation apparatus is coupled to the at least one lighting means and/or the one or more additional lighting means and is designed to modulate on a lighting-means-specific basis the detection radiation emitted into the detection region by the at least one lighting means and the additional lighting means, and the analysis unit is designed to analyze the received scattered and/or reflected detection radiation in terms of the modulation on a lighting-means-specific basis, in order to determine separately the portions reflected/scattered in the different spatial regions of the detection region, and to derive therefrom a position of the activation element in front of the at least one operator control element.

10. The operator control apparatus as claimed in claim 9, wherein the approach detection unit is designed to derive a movement of the activation element on the basis of the positions of the activation element which are sensed in chronological succession.

11. The operator control apparatus as claimed in claim 4, wherein a plurality or all of the lighting means selected from the group of lighting means which comprises the at least one lighting means, the additional lighting means and one or more further lighting means which emit detection radiation into one or more further detection regions are actuated by means of an electronic unit which is designed to be common thereto.

12. The operator control apparatus as claimed in claim 1, wherein the optical device comprises a cylinder lens for focusing the detection radiation into a spatial plane.

13. The operator control apparatus as claimed in claim 12, wherein the optical device comprises a deflection prism in order to cause the detection radiation to fan out in an angle range in a spatial plane.

14. A method for operating an operator control apparatus, wherein the operator control apparatus comprises at least one operator control element for capturing user inputs and an approach detection device which senses an approach of an activation element, comprising a body part of a user, to the operator control element before the operator control element is touched, wherein
electromagnetic detection radiation is emitted into a spatially limited detection region in front of the operator control element by means of at least one lighting means, wherein the detection region does not comprise an entire volume in front of the at least one operator control element, and by means of a receiver element a portion of the detection radiation which is scattered at the activation element and/or reflected by this activation element is received when the activation element of the user approaches the at least one operator control element, and the approach is detected on the basis of the intensity of the received portion of the detection radiation,
and wherein the detection radiation of the at least one lighting means is emitted into a fan-shaped spatial region by means of an optical device.

15. The method as claimed in claim 14, wherein the at least one operator control element is a touchscreen, and when an approach is detected the representation on the touchscreen is adapted.

16. The method as claimed in claim 15, wherein the detection radiation of the at least one lighting means is emitted into a detection region lying in a detection plane, adjacent to an edge of a display surface of the touchscreen, wherein the detection plane and a plane of the display surface enclose an angle (.alpha.) of less than 90.degree.

17. The method as claimed in claim 14, wherein detection radiation is emitted by means of at least one further lighting means into a further detection region which is not located in front of the at least one operator control element, wherein the detection radiation emitted into the further detection region is modulated differently from the detection radiation emitted into the detection region, and the received scattered detection radiation is analyzed in terms of the modulation in order to determine separately the portion of the detection radiation emitted and reflected/scattered into the detection region and the portion of the detection radiation emitted and reflected/scattered into the further detection region, and penetration of the activation element into the at least one further detection region is detected on the basis of the intensity of the portion of received reflected/scattered further detection radiation.

18. The method as claimed in claim 17, wherein the adaptation of the representation fails to occur if, in addition to the approach to the at least one operator control element, it is detected that the activation element penetrates the at least one further detection region.

19. The method as claimed in claim 18, characterized in that the further detection radiation is emitted in such a way that the further detection region is located in front of at least one further operator control element which is arranged adjacent to the at least one operator control element.

20. The method as claimed in claim 14, wherein in addition to the detection radiation, additional detection radiation of additional lighting means is emitted into the detection region, wherein the at least one lighting means and the additional lighting means emit the detection radiation into subregions of the detection region which are respectively different from one another, and the detection radiation and the additional detection radiation are modulated on a lighting-means-specific basis, and the received scattered and/or reflected detection radiation is evaluated in terms of the modulation in order to determine the scattered and/or reflected portions on a lighting-means-specific basis, and a position of the activation element is derived therefrom.

21. The method as claimed in claim 20, wherein the portions of the received detection radiation are evaluated with time resolution on a lighting-means-specific basis, and a movement of the activation means is derived therefrom.

22. The method as claimed in claim 14, wherein reference radiation is directed onto the receiver element by means of a reference lighting means in a way which is chronologically offset with respect to the emission of the detection radiation, and a background radiation influence is determined from received reference radiation intensity determined at different times, and is taken into account in the determination of the intensity of the portion of reflected and/or scattered detection radiation.

* * * * *